United States Patent
Chiu et al.

(10) Patent No.: US 6,770,979 B2
(45) Date of Patent: Aug. 3, 2004

(54) SEMICONDUCTOR PACKAGE AND SUBSTRATE THEREOF

(75) Inventors: Chi Tsung Chiu, Kaohsiung (TW); Ted Wang, Kaohsiung (TW); Samuel Wu, Kaohsiung (TW); Jenny Chen, Kaohsiung (TW)

(73) Assignee: Advanced Semiconductor Engineering Inc. (TW)

( * ) Notice: Subject to any disclaimer, the term of this patent is extended or adjusted under 35 U.S.C. 154(b) by 0 days.

(21) Appl. No.: 10/394,347

(22) Filed: Mar. 24, 2003

(65) Prior Publication Data

US 2004/0017007 A1 Jan. 29, 2004

(30) Foreign Application Priority Data

Jul. 18, 2002 (TW) .......................................... 91116215 A

(51) Int. Cl.[7] .............................................. H01L 29/40
(52) U.S. Cl. ........................................ 257/775; 257/784
(58) Field of Search ................................ 257/729, 773, 257/775, 784, 700

(56) References Cited

U.S. PATENT DOCUMENTS 5,134,247 A * 7/1992 Wehner et al. ............. 174/52.4

* cited by examiner

Primary Examiner—Roy Potter

(57) ABSTRACT

Disclosed is a semiconductor package characterized by having at least one cavity defined in a substrate and at least one buffer pad disposed in the at least one cavity. The semiconductor package includes a semiconductor chip disposed on the substrate, at least one conductive trace connecting with the buffer pad and at least one bonding wire electrically connecting the semiconductor chip to the buffer pad. The buffer pad has a thickness larger than the thickness of the conductive trace.

14 Claims, 8 Drawing Sheets

SEMICONDUCTOR PACKAGE AND SUBSTRATE THEREOF

BACKGROUND OF THE INVENTION

1. Field of the Invention

This invention generally relates to a semiconductor package and a substrate therefore, and more specifically to a semiconductor package and a substrate therefor which are designed for overcoming or eliminating the signal reflection issues.

2. Description of the Related Art

In today's rapidly growing world of electronic products, there is a main tendency towards high speed circuits. One of the major issues in developing high speed circuits is how to maintain the signal integrity during the signal transmission through a line so that the correct waveform can be kept when the signal arrives the opposite terminal of the line. Otherwise, a waveform distortion may cause malfunction of the circuit, such as producing wrong output, running abnormally or being unable to work, and it makes the product become unmarketable. There are many sources for noise, and the signal reflection is one of the sources.

When a signal is transmitted through a medium, such as a copper line, a portion of the signal isn't sent to the opposite end of the medium but is reflected toward the signal source, it is so-called "signal reflection". The reflected signal tends to interfere constructively or destructively with the original signal at different locations of the signal path thereby altering the waveform of the original signal. This causes a misinterpretation of the signal upon receiving a signal with altered waveform. Furthermore, the higher the signal speed the more critical the signal reflection problem becomes.

There are two major causes for the signal reflection—one is an impedance mismatch between associated mediums (i.e., interconnecting lines), and the other is a non-linear change of the interconnecting line. Set forth below is one example of the signal reflection resulted from the "non-linear change" observed in a conventional semiconductor chip package. When the signal current transmitted from a chip through a substantially vertical gold wire flows into a horizontal conductive trace on a substrate supporting the chip, the current along the vertical direction can hardly be changed to flow in the horizontal direction immediately thereby creating a discontinuity between the gold wire and the conductive trace such that a signal reflection will occur at the discontinuity. Accordingly, there exists a need in the art for a semiconductor package which overcomes, or at least reduces the signal reflection issues.

SUMMARY OF THE INVENTION

It is an object of the present invention to provide a semiconductor package utilizing a substrate which can overcome or reduce the problem of the signal reflection occurring at the contact pad on the substrate for wire bonding due to the non-linear change of the interconnecting line.

To achieve the above listed and other objects, the present invention provides a semiconductor package mainly including a substrate comprising a plurality of conductive traces, a semiconductor chip disposed on the upper surface of the substrate and a plurality of wires electrically connecting the semiconductor chip to the conductive traces of the substrate. The present invention is characterized in that the substrate has at least one cavity formed at the junction between the conductive trace on the substrate and the wire extending from the semiconductor chip. The at least one cavity is provided with at least one buffer pad which connects with the conductive trace on the substrate. The buffer pad has a thickness larger than the thickness of the conductive trace. Accordingly, when the signal current is transmitted from the chip through the wire in a substantially vertical direction to the conductive trace of the substrate, the buffer pad provides enough space for the current to change its flow in a horizontal direction thereby overcoming or at least reducing the problem of the signal reflection.

The cavity of the substrate has a depth between about one-third and about one-fifth of the thickness of the substrate and the buffer pad has a thickness substantially equal to the depth of the cavity. Both the buffer pad and the conductive trace on the substrate are made of substantially the same material (typically selected from materials which conduct electricity well, e.g., copper). Generally speaking, gold wires are chosen as the wires for electrically connecting the semiconductor chip to the conductive trace on the substrate. The buffer pad is further provided with a nickel layer formed thereon and a gold layer on the nickel layer thereby facilitating the bonding between the gold wire and the copper trace. Additionally, the substrate is further provided with a plurality of metal pads on the lower surface thereof, wherein the conductive trace is electrically connected to the metal pad by a plurality of plated via holes and to an outside circuit through a solder ball provided on the metal pad.

The present invention further provides methods of manufacturing a substrate for use in the aforementioned semiconductor package.

One method is conducted by processing a conventional substrate into the substrate suitable for use in the present invention. Steps to accomplish the method are described below. First, a substrate with a plurality of conductive traces and a solder mask is used. Next, at least one cavity is formed in the substrate by mechanical drilling or laser ablation. Then the cavity is filled with conductive material (same as the material of the conductive trace, e.g., copper) through a selectively filling step to form at least one buffer pad adapted for wire bonding to the semiconductor chip. According to one embodiment of the present invention, the selectively filling step is accomplished by the following steps. First, a first shielding layer is formed on the entire upper surface of the substrate with the at least one cavity exposed from the first shielding layer. Next, a layer of conductive material is deposited on the upper surface of the substrate by electroless plating. Then, the first shielding layer is removed from the substrate. A second shielding layer is formed on the conductive trace which is exposed from the solder mask and only the at least one cavity is exposed. Next, the cavity is filled with conductive material by electroplating. Finally, the second shielding layer is removed and the filling step is completed. Alternatively, before the second shielding layer is removed, a nickel layer may be formed on the buffer pad and a gold layer may be formed on the nickel layer.

The present invention provides another method of manufacturing a substrate for use in a semiconductor chip package. The method comprises the following steps. First, at least one cavity is formed in the upper surface of a dielectric layer and a plurality of via holes are formed through the dielectric layer by mechanical drilling or laser ablation. Next, a metal layer is formed over the entire surface of the dielectric layer including the at least one cavity and the surface of the via holes. Then, the metal layer is selectively etched to form a predetermined circuit comprising a plurality of conductive traces on the upper surface of the dielectric layer, wherein at least one conductive trace has one end covering the at least one cavity. Next, the at least one cavity is filled with conductive material (same as the material of the aforementioned metal layer) by a selectively filling step so as to form at least one buffer pad adapted for wire bonding to the semiconductor chip. According to one embodiment of the present invention, the selectively filling step is accomplished by the following steps: A layer of solder mask is formed on the entire upper surface of the dielectric layer and the conductive traces with the at least one cavity exposed from the solder mask. The cavity is filled with conductive material by electroplating. Then, the solder mask on predetermined portions (e.g., fingers or solder pads) of the conductive traces is removed. Thereafter, a nickel layer is formed on both the buffer pad and the predetermined portions of the conductive traces which are exposed from the solder mask. Finally, a gold layer is formed on the nickel layer.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 1:
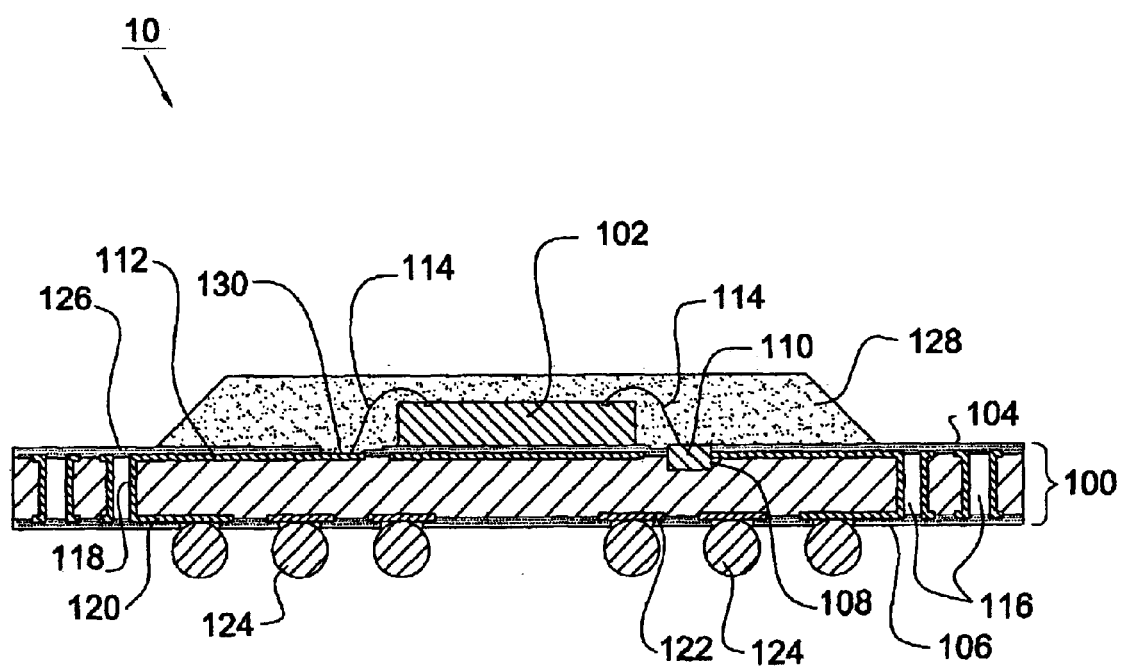
FIG. 1 is a cross sectional view of a semiconductor package according to one embodiment of the present invention.

FIG. 1 illustrates a semiconductor package 10 according to one embodiment of the present invention. The semiconductor package 10 generally comprises a substrate 100 and a semiconductor chip disposed on the upper surface 104 of the substrate 100. The present invention is characterized in that the substrate has a cavity 108 (although only one cavity is illustrated in FIG. 1, an substrate for use with the invention can include any number of cavities if desired) defined therein and has a buffer pad 110 formed in the cavity 108 and connecting with a conductive trace 112 on the upper surface 104 of the substrate 100, wherein the buffer pad 100 has a thickness larger than the thickness of the conductive trace 112. The buffer pad 110 and other contact pads 130 provided on the substrate 100 are electrically connected to the semiconductor chip 102 by a plurality of wires 114 (typically, gold wires).

The cavity 108 is designed to have a depth between about one-third and about one-fifth of the thickness of the substrate 100. The buffer pad 110 has a thickness substantially equal to the depth of the cavity 108 such that the thickness of the buffer pad 110 is larger than the thickness of the conductive trace 112. Both the buffer pad 110 and the conductive trace 112 on the substrate are made of substantially the same material (typically selected from materials which conduct electricity well, e.g., copper). The buffer pad 110 is further provided with a nickel layer (not shown) formed thereon and a gold layer on the nickel layer thereby facilitating the bonding between the wire 114 of gold and the buffer pad 110 of copper.

The substrate 100 further comprises a plurality of via holes 116 through the substrate 100. The via holes are plated with a metal layer 118 on the surface thereof so as to electrically connect the conductive traces 112 on the upper surface of the substrate to the conductive traces 120 and the metal pads 122 acting as solder pads on the lower surface of the substrate. The metal pads 122 are provided with solder balls 124 for making external electrical connection.

The substrate 100 has a solder mask 126 on the surface thereof for protecting the circuits on the substrate 100 and preventing the traces inside the substrate 100 from being influenced by environmental factors like moisture. The solder mask 126 is formed on the entire surface of the substrate 100 with only the pads 130 for electrically connecting with the chip, the buffer pads 110 and the metal pads 122 exposed from the solder mask 126. Additionally, the semiconductor package 10 further comprises a package body 128 encapsulating the electrically connecting portions between the chip 102 and the conductive traces 112 on the substrate to prevent the damage caused by moisture, dust or other physical factors.

Figure 2A:
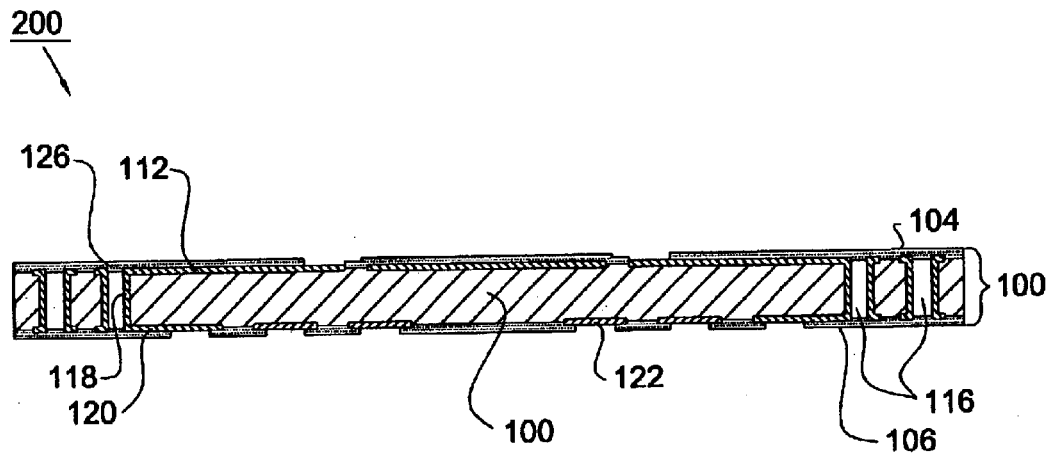
FIGS. 2a to 2g illustrate, in cross-sectional view, the major steps in a method of manufacturing a substrate for use in a semiconductor chip package according to one embodiment of the present invention.

The present invention further provides methods of manufacturing the substrate for use in the semiconductor chip package, specifically the substrate provided with the aforementioned buffer pads. The major steps of one method are described below in connection with FIGS. 2a–2g. First, a substrate manufactured in a conventional way is used. As shown in FIG. 2a, the substrate 200 has a plurality of metal-plated via holes 116, a predetermined circuit (including the conductive traces 112 on the upper surface 104 of the substrate, and the conductive traces 120 and the metal pads 122 acting as the solder pads on the lower surface 106 of the substrate) and a solder mask 126.

Figure 2B:
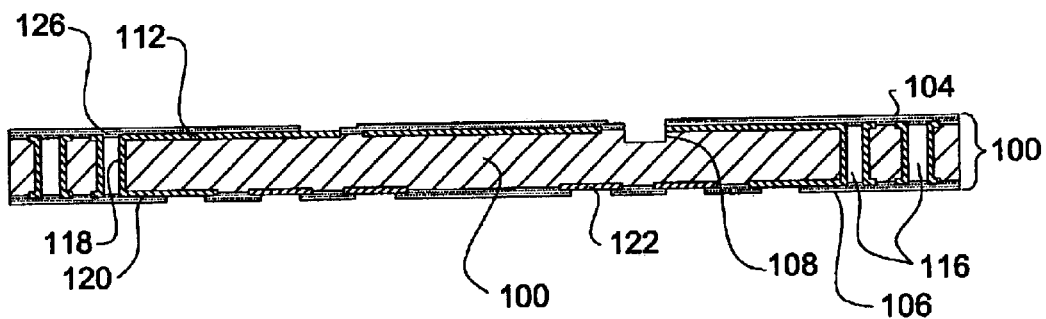

Next, as shown in FIG. 2b, at least one cavity 108 is formed at the predetermined area on the upper surface 104 of the substrate 200 by mechanical drilling or laser ablation. The cavity 108 has a depth of between about one-third and about one-fifth of the thickness of the substrate 200. According to one embodiment of the present invention, the cavity 108 may be designed to have a depth of 20 $\mu$m when the substrate 200 is 100 $\mu$m thick.

Figure 2C:
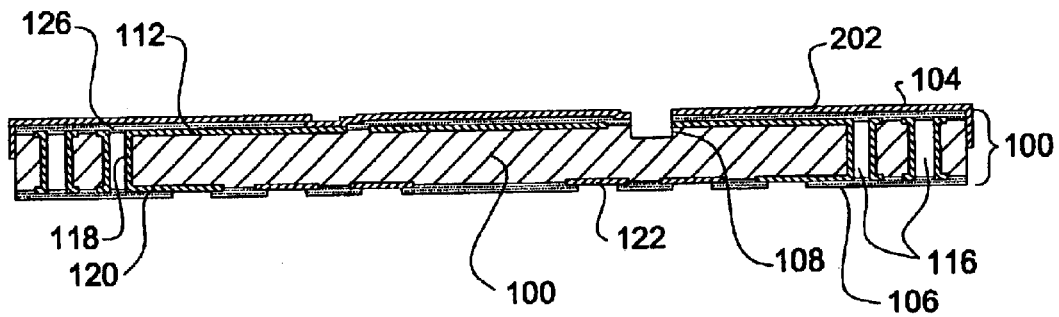

Then the cavity 108 is filled with conductive material (same as the material of the conductive trace, e.g., copper) by a selectively filling step to form at least one buffer pad 110 adapted for wire bonding to the semiconductor chip 102. According to one embodiment of the present invention, the selectively filling step includes the following steps. First, a shielding layer 202 is formed on the entire surface of the substrate 200 (or at least of the upper half of the substrate 200). More specifically, the shielding layer 202 is formed on the solder mask 126 and the portions exposed from the solder mask such that only the cavity 108 on the substrate 200 is exposed from the shielding layer 202 (as shown in FIG. 2c). According to one embodiment of the present invention, the shielding layer may be accomplished by directly attaching a tape to the substrate 200 wherein the tape has an opening to expose the cavity 108.

Figure 2D:
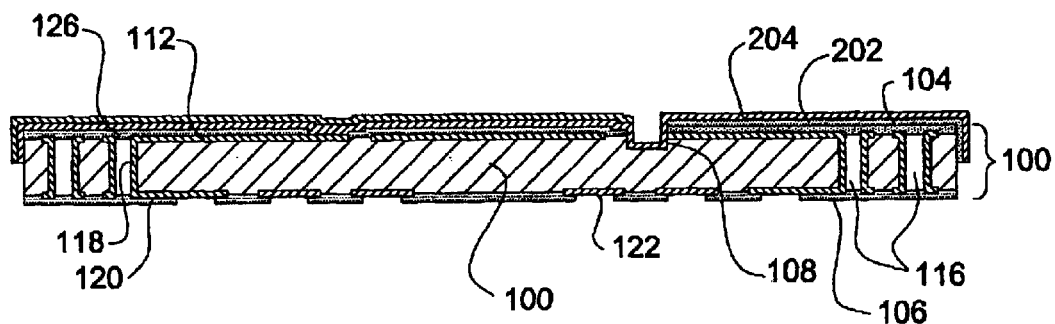
Figure 2E:
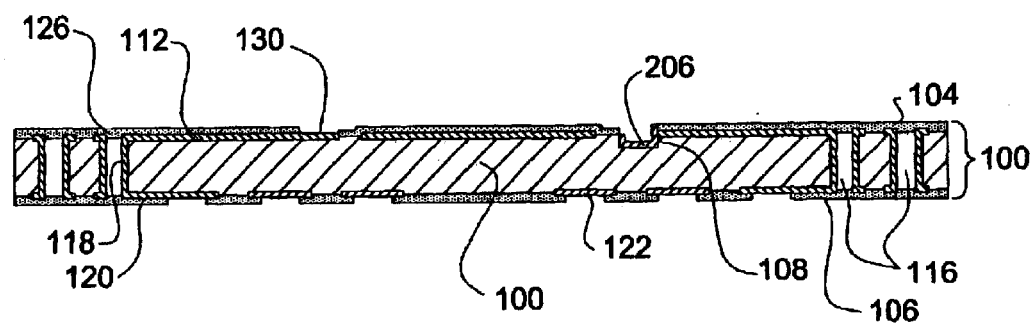

Referring to FIG. 2d, a metal layer of the same material as the conductive traces is formed on the surface of the shielding layer 202 and the cavity 108 of the substrate 200 by electroless plating. Specifically, a material which becomes the nucleus of plating, such as palladium, is deposited on the surface of the shielding layer 202 on the upper half of the substrate 200 and the surface of the cavity 108 which, in turn, is contacted with an electroless plating solution (such as electroless copper bath in this embodiment) so that the plating metal will be deposited over the surface of the shielding layer 202 and the cavity 108. The metal layer 204 establishes electrical connections with the conductive trace 112 adjacent to the cavity 108. Then, the shielding layer 202 is removed from the surface of the upper half of the substrate such that only the metal layer 206 (see FIG. 2e) is left on the surface of the cavity 108.

Figure 2F:
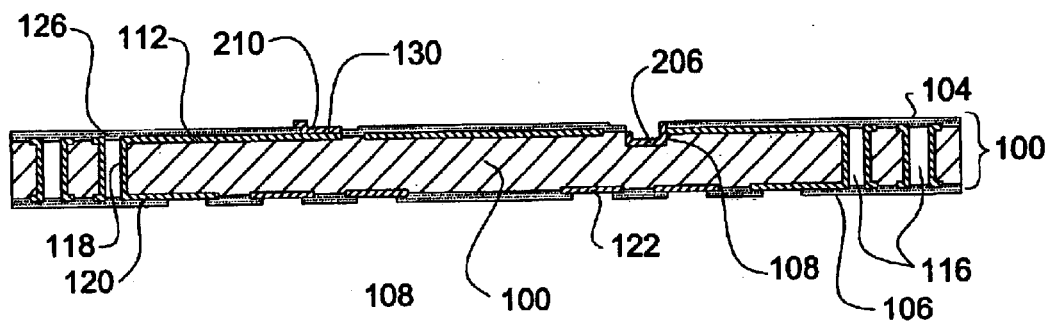
Figure 2G:
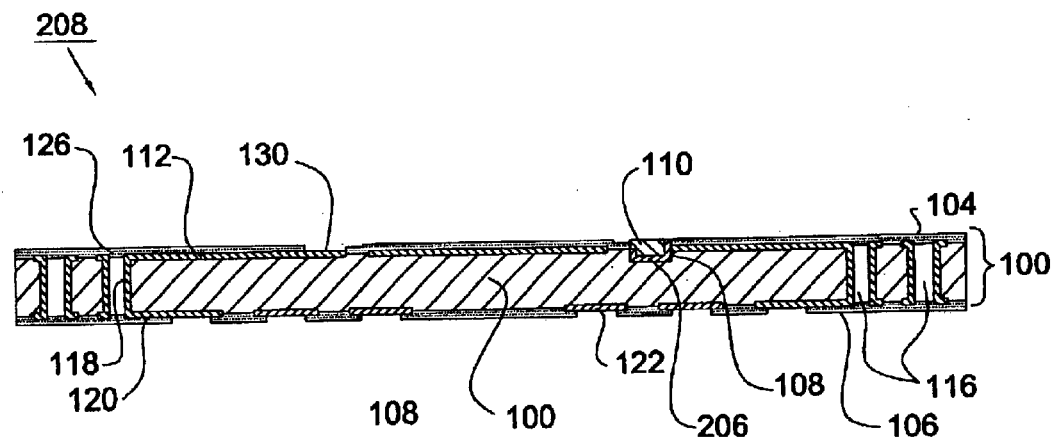

Referring to FIG. 2f, another shielding layer 210 is formed on the upper surface of the substrate 100 to cover all the conductive traces exposed from the solder mask 126 (e.g., the contact pads 130) such that only the cavity 108 is exposed. According to one embodiment of the present invention, the shielding layer 210 may be accomplished by directly attaching a tape to the substrate 200 wherein the tape has an opening to expose the cavity 108.

Next, the cavity 108 is filled with metal by electroplating through the metal layer 206 thereon so as to form the buffer pad 110. Finally, the shielding layer 210 is removed to obtain the substrate 208 with the buffer pad 110 of the present invention (see FIG. 2g).

Additionally, in order to improve the bonding between the buffer pad 110 of copper and the wire 114 of gold, a nickel layer is selectively formed on the exposed buffer pad 110 by electroplating and a gold layer is formed on the nickel layer before the shielding layer 210 is removed.

Figure 3A:
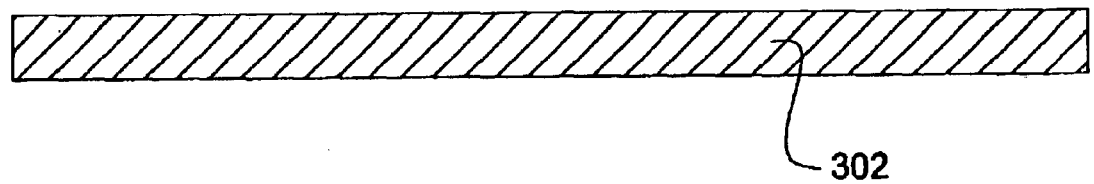
FIGS. 3a to 3g illustrate, in cross-sectional view, the major steps in a method of manufacturing a substrate for use in a semiconductor chip package according to another embodiment of the present invention.
Figure 3B:
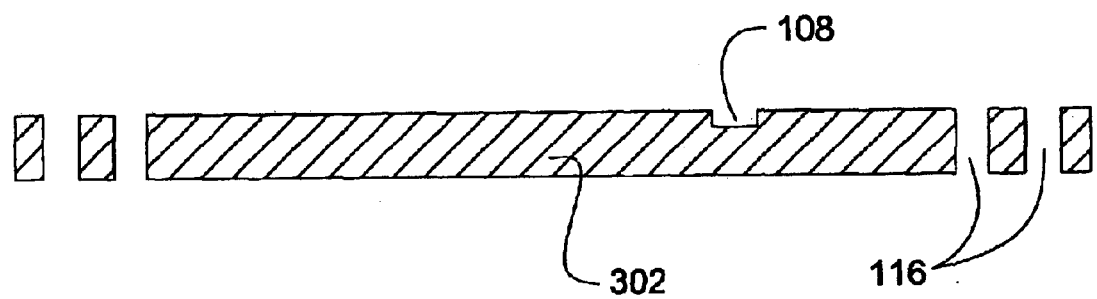
Figure 3C:
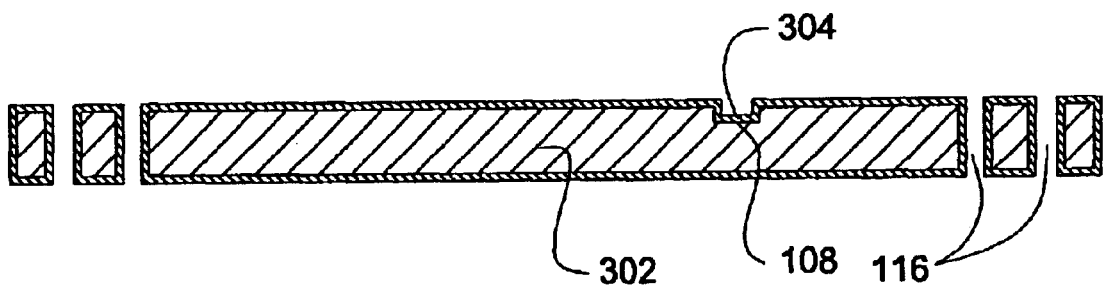
Figure 3D:
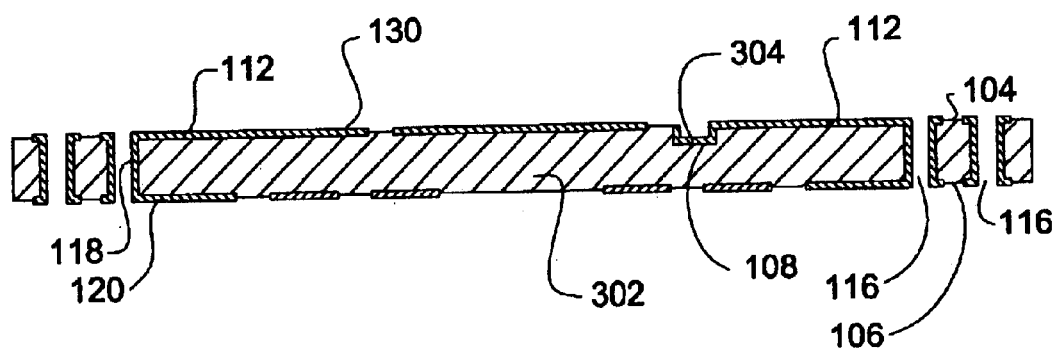
Figure 3E:
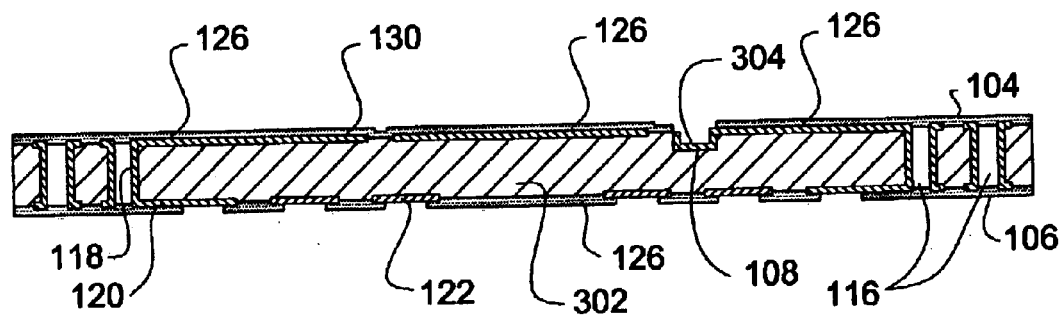

The present invention further provides another method of manufacturing the substrate for use the semiconductor chip package. The major steps of the method are described below in connection with FIGS. 3a–3g. First, referring to FIG. 3a, a dielectric layer 302 preferably made of bismaleimide-triazine resin or fiberglass reinforced epoxy resin is used. As shown in FIG. 3b, at least one cavity 108 and a plurality of via holes 116 are formed in the predetermined areas on the dielectric layer 302 by mechanical drilling or laser ablation. Referring to FIG. 3c, a metal (e.g., copper) layer 304 is formed on the entire surface of the dielectric layer 302 including the cavity 108 and the via holes 116. Then, the metal layer 304 on the dielectric layer 302 is defined by photolithography etching to form the desired circuit. As shown in FIG. 3d, the circuit comprises the conductive traces 112 on the upper surface of the dielectric layer 302, the metal layer 118 on the surface of the via holes, the conductive traces 120 and the metal pads 122 acting as the solder pads on the lower surface of the dielectric layer 302. It should be noted that at least one of the conductive traces 112 has one end covering on the cavity 108. Referring to FIG. 3e, a layer of solder mask 126 is applied to the entire surface of the dielectric layer 302 including the conductive traces 112 and 120. It should be noted that, in this step, only the cavity 108 which is covered by one end of the conductive trace 112 is exposed from the solder mask 126, and the contact pads 130 on the upper surface of the dielectric layer 302 which is predetermined to be exposed from the solder mask 126 is still covered by the solder mask 126 in this step.

Figure 3F:
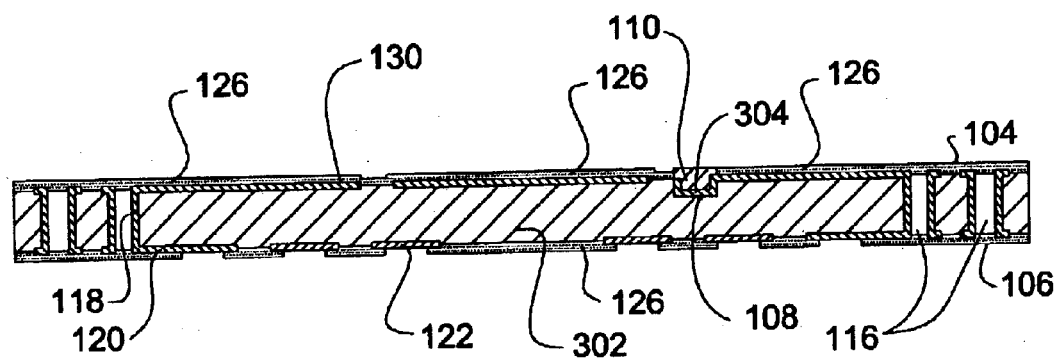
Figure 3G:
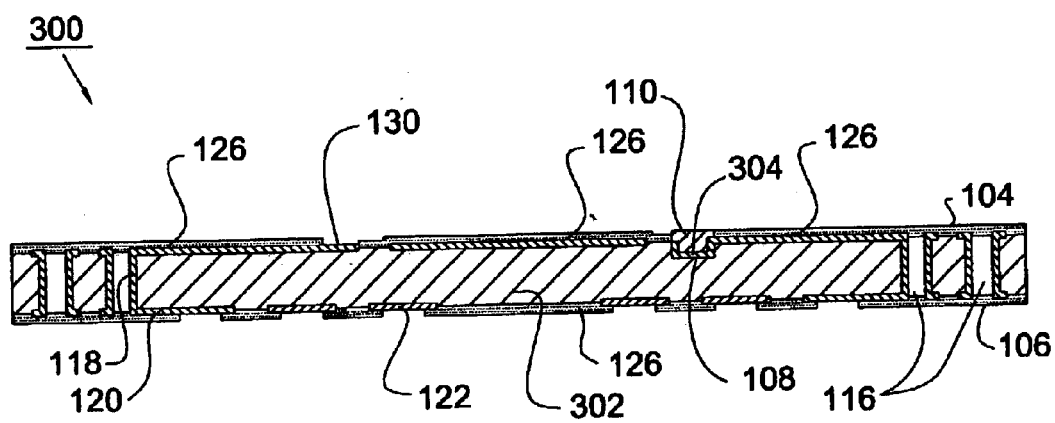

Referring to FIG. 3f, a layer of metal (e.g., copper) is formed on the cavity 108 which is exposed from the solder mask 126 and has a metal layer thereon by electroplating until the cavity 108 is filled with the metal to form a buffer pad 108. Then, the solder mask on the contact pads 130 which are predetermined to be exposed from the solder mask 126 are removed to obtain the substrate 300 with the buffer pads 110 (see FIG. 3g).

Additionally, in order to improve the bonding between the buffer pad 110 of copper and the wire 114 of gold, a nickel layer can be formed on both the exposed buffer pad 110 and the contact pads 130, and thereafter a gold layer can be formed on the nickel layer.

Figure 4:
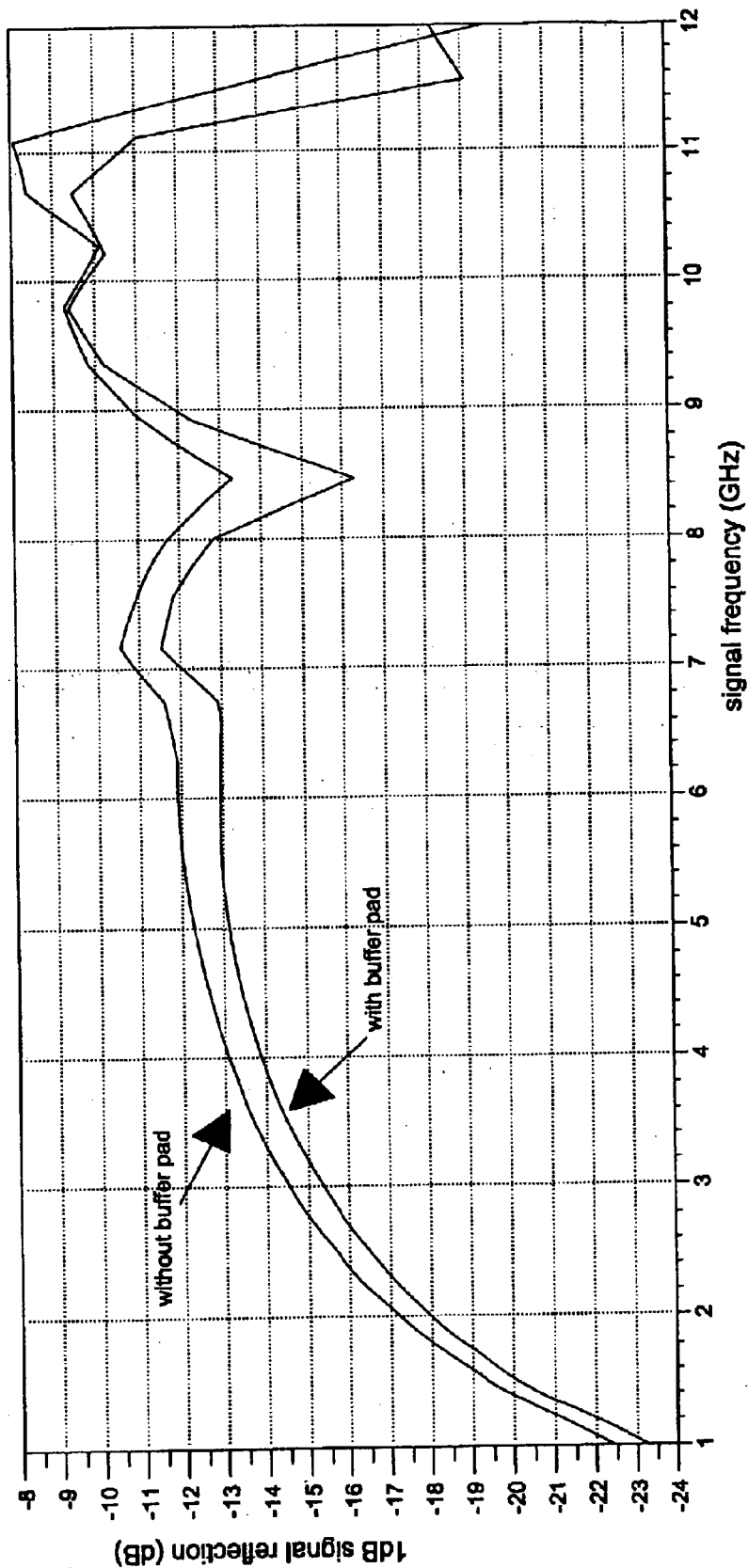
FIG. 4 is a computer simulation graph showing a relation between a signal frequency and a signal reflection observed in a conventional semiconductor package having contact pads with a typical thickness and a semiconductor package having thickened buffer pads according to one embodiment of the present invention.

The present invention is characterized by providing at least one buffer pad disposed at the junction between the conductive trace on the substrate and the wire which is adapted for connecting the chip and the substrate. The buffer pad has a thickness larger than the thickness of the conductive trace. The design of the buffer pad can offer a buffer space in which the signal transmitted from the chip to the substrate in vertical direction through the wire can change its flow in horizontal direction. A computer simulation result obtained by the high frequency structure simulator available from Ansoft Corporation shows that the present invention overcomes or at least reduces the signal reflection problem. The details will be described below. First, the three-dimensional structures of the present semiconductor chip package with thickened buffer pad and the conventional semiconductor chip package (without buffer pad, only with contact pads having a typical thickness) are input into the simulator. Then, the excited port and the frequency range of a signal are set up. Finally, a simulation is performed to obtain the signal reflection (see FIG. 4) at the aformentioned junction between the wire and the conductive trace when 1 dB signal is transmitted through them. As shown in FIG. 4, the signal reflection of the present semiconductor chip package (with buffer pad) is lower than the signal reflection of the conventional semiconductor chip package (without buffer pad) in a variety of frequency ranges. Therefore, the package substrate with the buffer pad of the present invention can reduce the signal reflection efficiently.

Although the invention has been explained in relation to its preferred embodiment, it is to be understood that many other possible modifications and variations can be made without departing from the spirit and scope of the invention as hereinafter claimed.

What is claimed is:

1. A semiconductor package comprising:
   a substrate having an upper surface, a lower surface and at least one cavity defined therein;
   the upper surface of the substrate being provided with at least one buffer pad disposed in the at least one cavity and at least one conductive trace connecting to the buffer pad, wherein the buffer pad has a thickness larger than the thickness of the conductive trace;
   a semiconductor chip disposed on the upper surface of the substrate; and
   at least one wire electrically connecting the semiconductor chip to the buffer pad.

2. The semiconductor package as claimed in claim 1, wherein the cavity of the substrate has a depth between about one-third and about one-fifth of the thickness of the substrate.

3. The semiconductor package as claimed in claim 1, wherein the cavity of the substrate has a depth of about 20 μm.

4. The semiconductor package as claimed in claim 1, wherein the buffer pad has a thickness substantially equal to the depth of the cavity of the substrate.

5. The semiconductor package as claimed in claim 1, wherein both the buffer pad and the conductive trace are made of substantially the same material.

6. The semiconductor package as claimed in claim 1, further comprising a nickel layer formed on the buffer pad and a gold layer formed on the nickel layer.

7. The semiconductor package as claimed in claim 1, wherein the substrate has a plurality of metal pads on the lower surface thereof, and the conductive traces are electrically connected to the metal pads by a plurality of metal-plated via holes formed through the substrate.

8. A substrate for use in packaging a semiconductor chip comprising:
   at least one cavity defined in the substrate;
   at least one buffer pad disposed in the at least one cavity and adapted for wire bonding to the semiconductor chip; and
   at least one conductive trace connecting to the buffer pad, wherein the buffer pad has a thickness larger than the thickness of the conductive trace.

9. The substrate as claimed in claim 8, wherein the cavity of the substrate has a depth of between about one-third and about one-fifth of the thickness of the substrate.

10. The substrate as claimed in claim 8, wherein the cavity of the substrate has a depth of about 20 $\mu$m.

11. The substrate as claimed in claim 8, wherein the buffer pad has a thickness substantially equal to the depth of the cavity of the substrate.

12. The substrate as claimed in claim 8, wherein both the buffer pad and the conductive trace are made of substantially the same material.

13. The substrate as claimed in claim 8, further comprising a nickel layer formed on the buffer pad and a gold layer formed on the nickel layer.

14. The substrate as claimed in claim 8, wherein the buffer pads are provided on the upper surface of the substrate and the substrate has a plurality of metal pads on the lower surface thereof, wherein the conductive trace is electrically connected to the metal pad by a plurality of metal-plated via holes formed through the substrate.

* * * * *